United States Patent
Liu (10) Patent No.: US 11,018,194 B2
(45) Date of Patent: May 25, 2021

(54) DISPLAY SUBSTRATE AND METHOD OF MANUFACTURING THE SAME, AND DISPLAY PANEL

(71) Applicant: BOE Technology Group Co., Ltd., Beijing (CN)

(72) Inventor: Xiaoyun Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/515,197

(22) Filed: Jul. 18, 2019

(65) Prior Publication Data

US 2020/0152711 A1 May 14, 2020

(30) Foreign Application Priority Data

Nov. 13, 2018 (CN) .......................... 201811346697.2

(51) Int. Cl.
*H01L 27/32* (2006.01)
*H01L 51/52* (2006.01)
*H01L 51/56* (2006.01)

(52) U.S. Cl.
CPC ...... *H01L 27/3211* (2013.01); *H01L 51/5218* (2013.01); *H01L 51/5265* (2013.01);
(Continued)

(58) Field of Classification Search
CPC . H01L 51/5218; H01L 51/5265; H01L 51/56; H01L 27/3246; H01L 2251/5315; H01L 2251/558; H01L 27/3211
(Continued)

(56) References Cited

U.S. PATENT DOCUMENTS 9,257,681 B2  2/2016 Min
10,297,792 B2  5/2019 Park et al.
(Continued)

FOREIGN PATENT DOCUMENTS

CN     103441136 A    12/2013
CN     104716158 A     6/2015
(Continued)

OTHER PUBLICATIONS

First Office Action, including Search Report, for Chinese Patent Application No. 201811346697.2, dated May 9, 2020, 17 pages.

*Primary Examiner* — Dzung Tran
(74) *Attorney, Agent, or Firm* — Westman, Champlin & Koehler, P.A.

(57) ABSTRACT

In one embodiment, there is provided a display substrate including: a base substrate; a plurality of pixels on the base substrate; and a pixel definition layer on the base substrate, defining the pixels and separating the pixels from one another. Each of the pixels includes: a first electrode assembly, a light-emitting function layer and a second electrode arranged sequentially in a direction away from the base substrate, and the second electrodes of the pixels form a common electrode layer extending over the pixel definition layer. In each of the pixels, a distance between a surface of the pixel definition layer away from the base substrate and a surface of the light-emitting function layer away from the base substrate in the direction away from the base substrate is less than or equal to a preset threshold that is in a range of about 0 Å to about 300 Å.

13 Claims, 6 Drawing Sheets

(52) U.S. Cl.
CPC .......... *H01L 51/56* (2013.01); *H01L 27/3246* (2013.01); *H01L 2251/5315* (2013.01); *H01L 2251/558* (2013.01)

(58) Field of Classification Search
USPC .......................................................... 257/89
See application file for complete search history.

(56) References Cited

U.S. PATENT DOCUMENTS

| | | | |
|---|---|---|---|
| 2005/0269947 A1* | 12/2005 | Kobayashi | H01L 27/3211 |
| | | | 313/504 |
| 2006/0214573 A1* | 9/2006 | Maeda | H01L 51/5271 |
| | | | 313/506 |
| 2007/0102737 A1* | 5/2007 | Kashiwabara | H01L 27/3279 |
| | | | 257/291 |
| 2007/0228367 A1* | 10/2007 | Nakamura | H01L 51/5265 |
| | | | 257/40 |
| 2008/0111474 A1* | 5/2008 | Sung | H01L 27/322 |
| | | | 313/504 |
| 2008/0258609 A1 | 10/2008 | Nakamura | |
| 2015/0171379 A1 | 6/2015 | Min | |
| 2018/0062116 A1 | 3/2018 | Park et al. | |

FOREIGN PATENT DOCUMENTS

| | | | |
|---|---|---|---|
| CN | 107275503 A | 10/2017 | |
| CN | 107799563 A | 3/2018 | |
| CN | 108695359 A | 10/2018 | |
| JP | 2013058446 A | 3/2013 | |

\* cited by examiner

FIG. 1

(PRIOR ART)

DISPLAY SUBSTRATE AND METHOD OF MANUFACTURING THE SAME, AND DISPLAY PANEL

CROSS-REFERENCE TO RELATED APPLICATION

This application claims priority to Chinese Patent Application No. 201811346697.2 filed on Nov. 13, 2018 in the State Intellectual Property Office of China, the present disclosure of which is hereby incorporated by reference in its entirety.

TECHNICAL FIELD

The present disclosure relates to the field of display technology, and particularly, to a display substrate and a method of manufacturing the same, and a display panel.

BACKGROUND

Organic Light-Emitting Diode (OLED) display products are widely favored at present.

In an OLED display product, a Pixel Definition Layer (PDL) is used to define a plurality of pixels, and first electrode assemblies and light-emitting function layers for different colors are disposed in the pixels defined by the pixel definition layer. For a top emission type OLED display device, the first electrode assembly includes a reflective electrode, so that light emitted by a light-emitting sub-layer in the light-emitting function layer is reflected between the reflective electrode and a transflective second electrode, thereby realizing micro-resonance light emission of the pixel.

SUMMARY

According to an aspect of the present disclosure, there is provided a display substrate, comprising:
a base substrate,
a plurality of pixels on the base substrate; and
a pixel definition layer on the base substrate, the pixel definition layer defining the pixels and separating the pixels from one another;
wherein, each of the pixels comprises: a first electrode assembly, a light-emitting function layer and a second electrode arranged sequentially in a direction away from the base substrate, and the second electrodes of the pixels form a common electrode layer extending over the pixel definition layer;
wherein, in each of the pixels, a distance between a surface of the pixel definition layer away from the base substrate and a surface of the light-emitting function layer away from the base substrate in the direction away from the base substrate is less than or equal to a preset threshold that is in a range of about 0 Å to about 300 Å.

In some embodiments, the first electrode assemblies have light reflective property, and the second electrodes have light transflective property; and
the first electrode assembly in each of the pixels has a thickness configured such that a micro resonance cavity of the pixel in question has a length corresponding to a color of the each of the pixels, the length of the micro resonance cavity being a distance between a reflective surface of the first electrode assembly and a light exit surface of the second electrode in the each of the pixels.

In some embodiments, the surface of the pixel definition layer away from the base substrate and the surface of the light-emitting function layer away from the base substrate are substantially aligned with each other.

In some embodiments, the light-emitting function layers in the pixels have a substantially same thickness.

In some embodiments, the light-emitting function layer comprises a hole transport sub-layer, a hole injection sub-layer, a light emitting sub-layer, an electron injection sub-layer, and an electron transport sub-layer.

In some embodiments, the first electrode assembly comprises a reflective electrode and a first transparent conductive layer arranged sequentially in the direction away from the base substrate, and the reflective surface of the first electrode assembly is a surface of the reflective electrode close to the first transparent conductive layer.

In some embodiments, the pixels comprises a red pixel, a green pixel and a blue pixel, and thicknesses of the first transparent conductive layers in the red pixel, the green pixel and the blue pixel are different from one another.

In some embodiments, the first electrode assembly in each of the pixels further comprises a second transparent conductive layer on a side of the reflective electrode close to the base substrate, thicknesses of the reflective electrodes in the red pixel, the green pixel and the blue pixel are different from one another, and thicknesses of the second transparent conductive layers in the red pixel, the green pixel and the blue pixel are substantially the same.

In some embodiments, the first electrode assembly in each of the pixels further comprises a second transparent conductive layer on a side of the reflective electrode close to the base substrate, thicknesses of the reflective electrodes in the red pixel, the green pixel and the blue pixel are substantially the same, and thicknesses of the second transparent conductive layers in the red pixel, the green pixel and the blue pixel are different from one another.

In some embodiments, the light-emitting function layers in the red pixel, the green pixel and the blue pixel are a red light-emitting function layer, a green light-emitting function layer and a blue light-emitting function layer, respectively, and thicknesses of the first transparent conductive layers in the red pixel, the green pixel and the blue pixel are decreased in that order.

In some embodiments, the light-emitting function layers in the red pixel, the green pixel and the blue pixel are a red light-emitting function layer, a green light-emitting function layer and a blue light-emitting function layer, respectively, and thicknesses of the reflective electrodes in the red pixel, the green pixel and the blue pixel are increased in that order.

In some embodiments, the light-emitting function layers in the red pixel, the green pixel and the blue pixel are a red light-emitting function layer, a green light-emitting function layer and a blue light-emitting function layer, respectively, and thicknesses of the second transparent conductive layers in the red pixel, the green pixel and the blue pixel are increased in that order.

According to another aspect of the present disclosure, there is provided a display panel comprising the display substrate according to any one of the above embodiments.

According to another aspect of the present disclosure, there is provided a method of manufacturing the display substrate according to any one of the above embodiments. The method comprises:
forming the first electrode assemblies on the base substrate;
forming the light-emitting function layers on the base substrate formed with the first electrode assemblies;

forming the pixel definition layer on the base substrate; and forming the second electrodes on the base substrate formed with the first electrode assemblies, the light-emitting function layers and the pixel definition layer.

In some embodiments, the pixels comprise a red pixel, a green pixel and a blue pixel;

the forming the first electrode assemblies comprises: forming second transparent conductive layers, reflective electrodes and first transparent conductive layers in that order;

wherein the forming the reflective electrodes comprises:
forming a plurality of reflective electrode material films in layers on the base substrate formed with the second transparent conductive layers; and
etching the reflective electrode material films in the red pixel, the green pixel and the blue pixel, respectively, so that the numbers of layers of the reflective electrode material films remained in the red pixel, the green pixel and the blue pixel are different.

In some embodiments, the forming the reflective electrodes further comprises:
forming a first reflective electrode material film with a first thickness on the base substrate formed with the second transparent conductive layers;
removing the first reflective electrode material film in the red pixel and the green pixel;
forming a second reflective electrode material film with a second thickness on the base substrate formed with the second transparent conductive layers;
removing the second reflective electrode material film in the red pixel; and
forming a third reflective electrode material film with a third thickness on the base substrate formed with the second transparent conductive layers.

In some embodiments, the pixels comprises a red pixel, a green pixel and a blue pixel;

the forming the first electrode assemblies comprises: forming second transparent conductive layers, reflective electrodes and first transparent conductive layers in that order;

wherein the forming the second transparent conductive layers comprises:
forming a plurality of second transparent conductive material films in layers on the base substrate; and
etching the second transparent conductive material films in the red pixel, the green pixel and the blue pixel, respectively, so that the numbers of layers of the second transparent conductive material films remained in the red pixel, the green pixel and the blue pixel are different.

In some embodiments, the forming the second transparent conductive layers further comprises:
forming a first layer of the second transparent conductive material films with a first thickness on the base substrate;
removing the first layer of the second transparent conductive material films in the red pixel and the green pixel;
forming a second layer of the second transparent conductive material films with a second thickness on the base substrate;
removing the second layer of the second transparent conductive material films in the red pixel; and
forming a third layer of the second transparent conductive material films with a third thickness on the base substrate.

In some embodiments, the forming the first transparent conductive layers comprises:

forming a plurality of first transparent conductive material films in layers on the base substrate formed with the second transparent conductive layers and the reflective electrodes; and
etching the first transparent conductive material films in the red pixel, the green pixel and the blue pixel, respectively, so that the numbers of layers of the first transparent conductive material films remained in the red pixel, the green pixel and the blue pixel are different.

In some embodiments, the forming the first transparent conductive layers further comprises:
forming a first layer of the first transparent conductive material films with a first thickness on the base substrate formed with the second transparent conductive layers and the reflective electrodes;
removing the first layer of the first transparent conductive material films in the blue pixel and the green pixel;
forming a second layer of the first transparent conductive material films with a second thickness on the base substrate formed with the second transparent conductive layers and the reflective electrodes;
removing the second layer of the first transparent conductive material films in the blue pixel; and
forming a third layer of the first transparent conductive material films with a third thickness on the base substrate formed with the second transparent conductive layers and the reflective electrodes.

DETAILED DESCRIPTION OF THE EMBODIMENTS

In order to enable those skilled in the art to better understand the technical solutions of the present disclosure, a display substrate, a method of manufacturing the same, and a display panel provided by the present disclosure are further described in detail below with reference to the accompanying drawings and specific embodiments.

Figure 1:
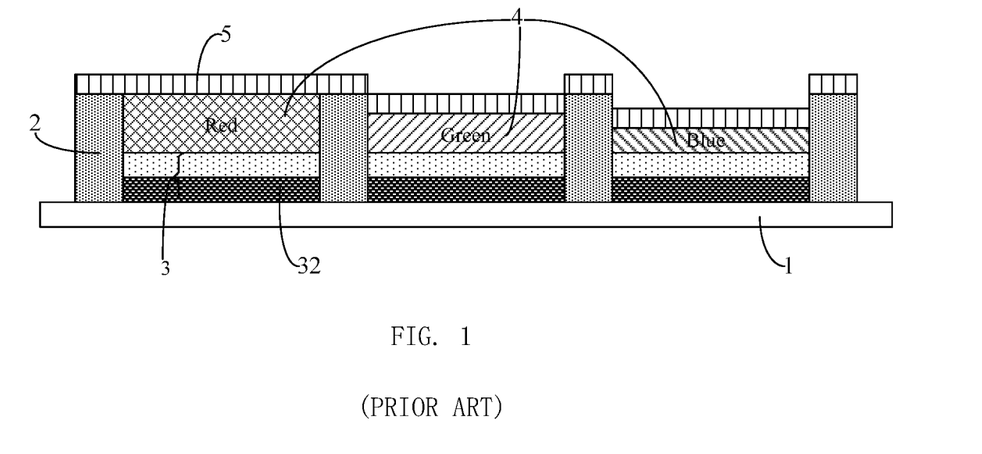
FIG. 1 is a schematic cross-sectional view showing a structure of an OLED display substrate in a related art.

In a related OLED display product, as shown in FIG. 1, a pixel definition layer (PDL) 2 is used to define a plurality of pixels and distribute them in an array on a base substrate 1. Lower pixels (pixel electrodes) 3 and light-emitting functional layers 4 with different colors are disposed in the pixels defined by the pixel definition layer. For the top emission type OLED display device, the lower electrode 3 in the pixel includes a reflective electrode 32, so that light emitted by a light-emitting layer in the light-emitting function layer is reflected between the reflective electrode 32 and a transflective upper electrode (common electrode) 5, thereby realizing micro-resonance light emission of the pixel.

In a related OLED display device, since the wavelengths of light emitted by the red, green and blue pixels are different, in order to ensure the color purity and light-emitting efficiency of the three color pixels, the lengths of the micro resonance cavities of the red, green and blue pixels (that is, distances between the reflective surfaces of the reflective electrodes 32 and the light exit surfaces of the upper electrodes 5) are different, and are generally achieved by means of different thicknesses of certain function sub-layers (for example, electron transport sub-layer, hole injection sub-layer, or the like) in the light-emitting function layers 4 for different colors. While, in the pixels of different colors, the lower electrodes 3 generally have the same thickness and the reflective electrodes 32 generally have the same thickness. On one hand, the upper electrodes 5 formed above the light-emitting function layers 4 are uneven and irregular. When the upper electrodes 5 have a small thickness, the upper electrodes 5 encounter poor lap joints. When the upper electrodes 5 have a large thickness, the light transmittance of the upper electrodes 5 is adversely affected, so that the light-emitting efficiency of the OLED display device is limited. On the other hand, in order to obtain optimal lengths of the micro resonance cavities of the red, green and blue pixels, the certain function sub-layers in the light-emitting function layers 4 for different colors are set to have different thicknesses. The luminous efficiency of the pixels is decreased due to severe light absorption of the certain function sub-layers.

Figure 2:
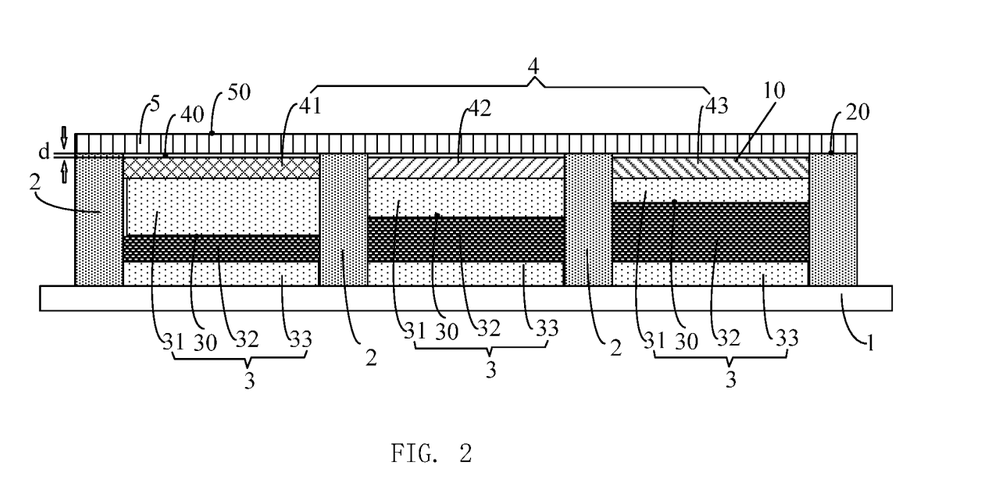
FIG. 2 is a schematic cross-sectional view showing a structure of a display substrate according to an embodiment of the present disclosure.

According to an embodiment of the present disclosure, there is provided a display substrate. Referring to FIG. 2, the display substrate comprises a base substrate 1, a plurality of pixels 10 on the base substrate 1, and a pixel definition layer 2 on the base substrate 1. The pixel definition layer 2 defines the pixels 10 and separates the pixels 10 from one another. Each of the pixels 10 comprises: a first electrode assembly 3, a light-emitting function layer 4 and a second electrode 5 arranged sequentially in a direction away from the base substrate 1, and the second electrodes 5 of the pixels 10 form a common electrode layer extending over the pixel definition layer 2. In each of the pixels 10, a distance d between a surface 20 of the pixel definition layer 2 away from the base substrate 1 and a surface 40 of the light-emitting function layer 4 away from the base substrate 1 in the direction away from the base substrate is less than or equal to a preset threshold that is in the range of about 0 Å to about 300 Å.

In this embodiment, the first electrode assemblies 3 have light reflective property, and the second electrodes 5 have light transflective property. The light-emitting function layers 4 in the pixels 10 are configured to emit light of different colors, respectively, to obtain a plurality of pixels of different colors. The first electrode assembly 3 in each pixel 10 has a thickness configured such that a micro resonance cavity of the each pixel has a length corresponding to a color of the each pixel, here, the length of the micro resonance cavity is a distance between a reflective surface 30 of the first electrode assembly 3 and a light exit surface 50 of the second electrode 5 in the each pixel.

In this embodiment, the base substrate is a TFT base substrate, and the surface layer which is for disposing the pixel definition layer and the pixels defined by the pixel definition layer, of the TFT base substrate is a planarization layer, and the planarization layer makes the surface of the TFT base substrate flush so as to form light-emitting function layers on the base substrate.

As described above, the preset threshold of the distance d between the surface 20 of the pixel definition layer 2 away from the base substrate 1 and the surface 40 of the light-emitting function layer 4 away from the base substrate 1 ranges from about 0 Å to about 300 Å. The distance within this range is significantly smaller than the distance between the surface of the pixel definition layer 2 away from the base substrate 1 and the surface of the light-emitting function layer 4 away from the base substrate 1 in the conventional display substrate, so that the lap surface of the second electrodes 5 tends to be gentle, thereby reducing or eliminating the poor lap joints of the second electrodes 5. In some embodiments, the distance d may range from about 30 Å to about 50 Å. In some other embodiments, for example, in the embodiments shown in FIG. 15 which will be described later, ideally, the distance d may be zero, at this time, the surface 20 of the pixel defining layer 2 away from the base substrate 1 coincides with the surface 40 of the light-emitting function layer 4 away from the base substrate 1.

Figure 15:
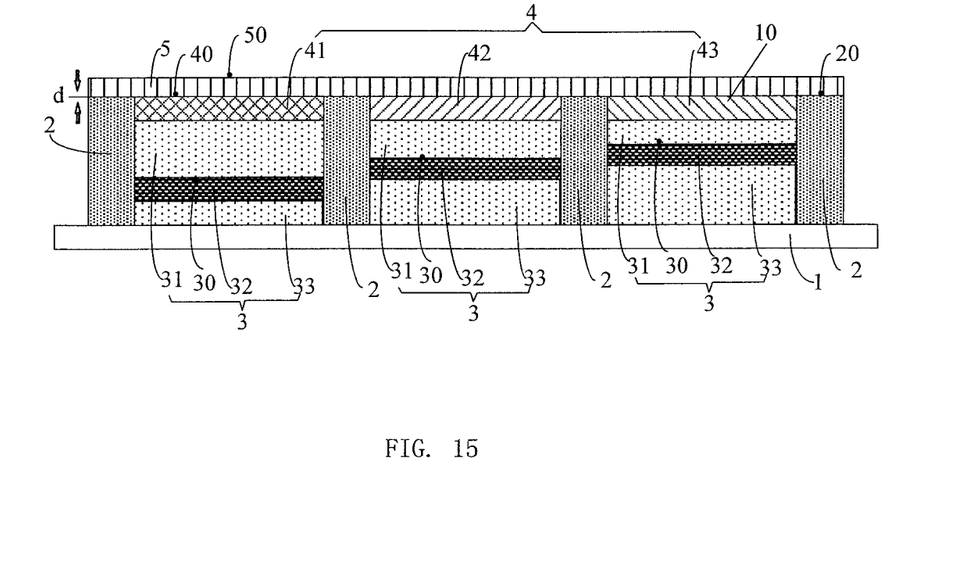
FIG. 15 is a schematic cross-sectional view showing a structure of a display substrate according to another embodiment of the present disclosure.

Exemplary, the surface of the pixel definition layer away from the base substrate 1 is substantially flush with the surface of the light-emitting function layer away from the base substrate 1. That is, the distance between the surface 20 of the pixel definition layer 2 away from the base substrate 1 and the surface 40 of the light-emitting function layer 4 away from the base substrate 1 is zero, as shown in the embodiment of FIG. 15. With this arrangement, it is possible to completely eliminate the poor lap joints of the second electrodes 5.

The light-emitting function layer 4 comprises a hole transport sub-layer, a hole injection sub-layer, a light emitting sub-layer, an electron injection sub-layer, and an electron transport sub-layer. In this embodiment, the light-emitting function layers 4 for emitting light of different colors have substantially the same thickness. In this way, compared with the conventional display substrate, it is not necessary to achieve optimal lengths of the micro resonance cavities in the pixels of different colors by means of different thicknesses of certain function sub-layers (for example, hole injection sub-layer, electron transport sub-layer, or the like) in the light-emitting function layers 4 for different colors. As a result, decrease of luminous efficiency of the pixels due to severe light absorption of the certain function sub-layers is prevented.

In this embodiment, the first electrode assembly 3 comprises a reflective electrode 32 and a first transparent conductive layer 31 arranged sequentially in a direction away from the base substrate 1. The reflective surface 30 of the first electrode assembly 3 is a surface of the reflective electrode 3 close to the first transparent conductive layer 31. The thicknesses of the first transparent conductive layers 31 in the pixels of different colors are different. In other words, in this embodiment, in the pixels of different colors, the reflective electrodes 32 have different thicknesses, the light-emitting function layers 4 for different colors have the same thickness, and the first transparent conductive layers 31 in the pixels of different colors have different thicknesses, so that the lengths of the micro resonance cavities in the pixels of different colors are different. As a result, the poor lap joints of the second electrodes 5 is eliminated while ensuring optimal lengths of the micro resonance cavities in the pixels of different colors on the display substrate are obtained, thereby not only ensuring the color purity and the luminous efficiency of the pixels of different colors, but also ensuring quality of the display substrate.

Exemplary, the first electrode assembly 3 further comprises a second transparent conductive layer 33 on a side of the reflective electrode 32 close to the base substrate 1, thicknesses of the reflective electrodes 32 in the pixels of different colors are different from one another, and thicknesses of the second transparent conductive layers 33 in the pixels of different colors are substantially the same. Provision of the second transparent conductive layer 33 ensures a firm bonding between the reflective electrode 32 and the base substrate 1. The second transparent conductive layer 33 has a thickness ranged from about 50 Å to about 100 Å. Of course, in other embodiments, no second transparent conductive layer 33 is provided in the first electrode assembly 3.

In this embodiment, each of the pixels 10 of different colors includes one light emitting functional layer 4 capable of emitting a color light corresponding to the color of the each pixel. Referring to FIG. 2, the pixels 10 on the base substrate include a red pixel, a green pixel, and a blue pixel, and the light-emitting function layers 4 in the pixels 10 respectively include a red light-emitting function layer 41, a green light-emitting function layer 42, and a blue light-emitting function layer 43. The thicknesses of the first transparent conductive layers 31 corresponding to the red light-emitting function layer 41, the green light-emitting function layer 42, and the blue light-emitting function layer 43 are sequentially decreased. In this way, the lengths of the micro-resonance cavities in the red pixel, the green pixel and the blue pixel can be optimized, thereby ensuring the color purity and luminous efficiency of the red pixel, the green pixel and the blue pixel, respectively. At the same time, compared with the prior art in which the optimal lengths of the micro resonance cavities in the pixels of different colors are generally achieved by means of different thicknesses of certain function sub-layers in the light-emitting function layers 4 for different colors, decrease of luminous efficiency of the pixels of different colors is prevented.

The thicknesses of the reflective electrodes 32 corresponding to the red light-emitting function layer 41, the green light-emitting function layer 42, and the blue light-emitting function layer 43 are sequentially increased. That is, in the embodiment, by adjusting the thicknesses of the reflective electrodes 32 in the pixels of different colors, not only the optimal lengths of the micro-resonant cavities of the pixels of different colors are achieved, but also it is ensured that the surface 20 of the pixel definition layer 2 away from the base substrate 1 is substantially flush with the surface 40 of the light-emitting function layer 4 away from the base substrate 1. As a result, not only the color purity and the luminous efficiency of the pixels of different colors in the display substrate are ensured, but also the poor lap joints of the second electrodes 5 are eliminated, and thus the quality of the display substrate is ensured.

In this embodiment, the thickness of the reflective electrode 32 is greater than or equal to about 1000 Å. On one hand, it can ensure that the reflective surface of the reflective electrode 32 can reflect light well, and on the other hand, the reflective electrodes 32 of different thicknesses in the pixels of different colors can assist achieving the optimal lengths of the micro resonance cavities in the pixels of different colors, thereby ensuring the pixels of different colors have the optimal color purity and luminous efficiency. The thickness of the second electrode 5 ranges from about 50 Å to about 80 Å. The distance between the surface of the pixel definition layer 2 away from the base substrate 1 and the surface of the light-emitting function layer 4 away from the base substrate 1 in the conventional display substrate is far greater than the distance d between the surface 20 of the pixel definition layer 2 away from the base substrate 1 and the surface 40 of the light-emitting function layer 4 away from the base substrate 1 according to the embodiments of the present disclosure, accordingly, in the embodiments of the present disclosure, it is not required to ensure the lap joint yield of the second electrodes 5 by setting the thickness of the second electrodes 5 to be large (for example, the thickness of the second electrode 5 in the conventional display substrate is usually about 120 Å). Therefore, in this embodiment, the thickness of the second electrode 5 can be set to be small, thereby it can achieve a good lap joint of the second electrodes 5 while improving the light transmittance of the second electrode 5.

In some embodiments, the surface of the base substrate where the pixel definition layer, the first electrode assemblies, the light-emitting function layers and the second electrodes are disposed is a flush surface.

It should be noted that the first electrode assembly in each pixel may also partially extend below the pixel definition layer, but the first electrode assemblies of adjacent pixels are not interconnected.

Based on the above structure of the display substrate, according to embodiments of the present disclosure, there is further provided a method of manufacturing a display substrate. The method comprises: forming the first electrode assemblies on the base substrate; forming the light-emitting function layers on the base substrate formed with the first electrode assemblies; forming the pixel definition layer on the base substrate; and forming the second electrodes on the base substrate formed with the first electrode assemblies, the light-emitting function layers and the pixel definition layer.

In some embodiments, the pixels in the display substrate manufactured by the above method comprise a red pixel, a green pixel and a blue pixel. The forming the first electrode assemblies comprises: forming the second transparent conductive layers, the reflective electrodes and the first transparent conductive layers in that order. In some embodiments, the forming the reflective electrodes comprises: forming a plurality of reflective electrode material films in layers on the base substrate formed with the second transparent conductive layers; and etching the reflective electrode material films in the red pixel, the green pixel and the blue pixel, respectively, so that the numbers of layers of the reflective electrode material films remained in the red pixel, the green pixel and the blue pixel are different. In some embodiments, the forming the first transparent conductive layers comprises: forming a plurality of first transparent conductive material films in layers on the base substrate formed with the second transparent conductive layers and the reflective electrodes; and etching the first transparent conductive material films in the red pixel, the green pixel and the blue pixel, respectively, so that the numbers of layers of the first transparent conductive material films remained in the red pixel, the green pixel and the blue pixel are different.

In this embodiment, referring to FIG. 3 to FIG. 8, the forming the reflective electrodes specifically comprises the following steps 01 to 06.

Figure 3:
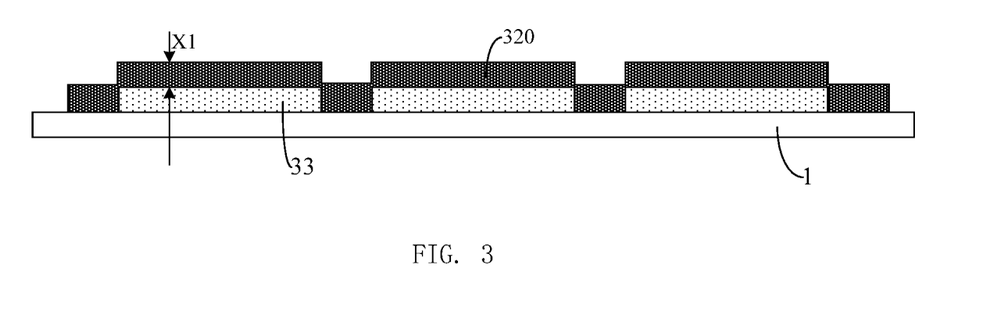
FIGS. 3-8 are respectively schematic views obtained after implementing steps of a method of manufacturing a display substrate according to an embodiment of the present disclosure, showing reflective electrodes of different thicknesses are respectively formed in pixels of different colors.

The step 01 is to form a first reflective electrode material film 320 with a first thickness X1 on the base substrate 1 formed with the second transparent conductive layers 33, as shown in FIG. 3.

Figure 4:
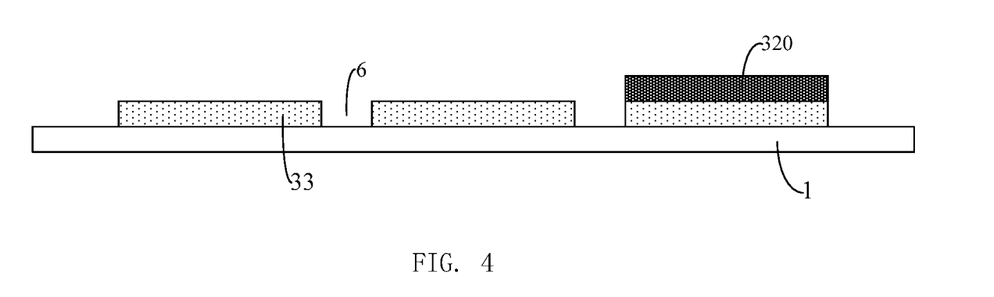

The step 02 is to remove the first reflective electrode material film 320 in the red pixel and the green pixel and the pixel definition layer formation region 6, as shown in FIG. 4.

Figure 5:
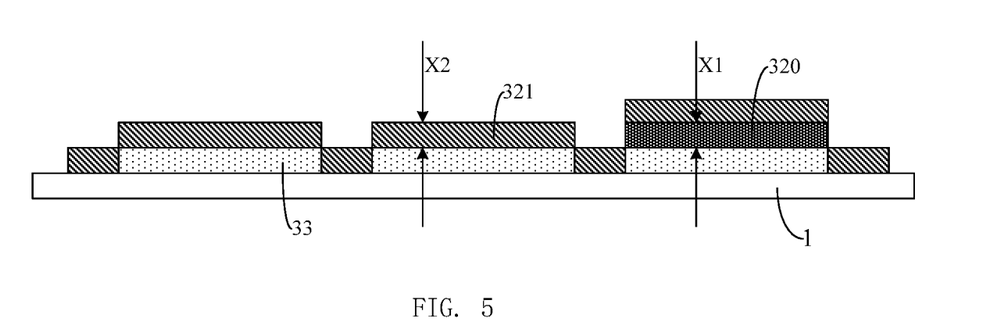

The step 03 is to form a second reflective electrode material film 321 with a second thickness X2 on the base substrate 1 formed with the second transparent conductive layers 33, as shown in FIG. 5.

Figure 6:
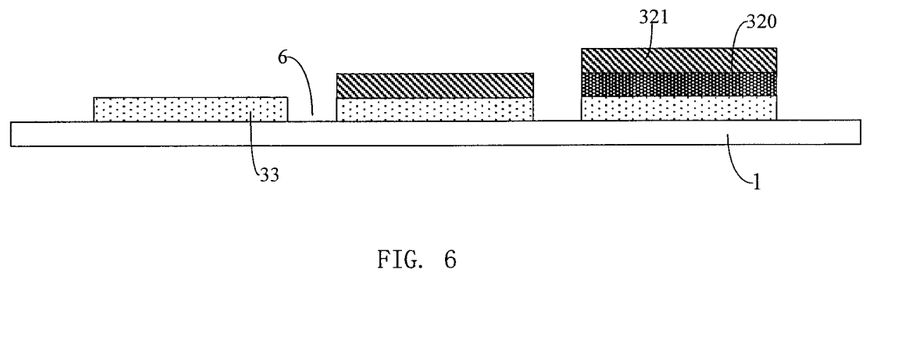

The step 04 is to remove the second reflective electrode material film 321 in the red pixel and the pixel definition layer formation region 6, as shown in FIG. 6.

Figure 7:
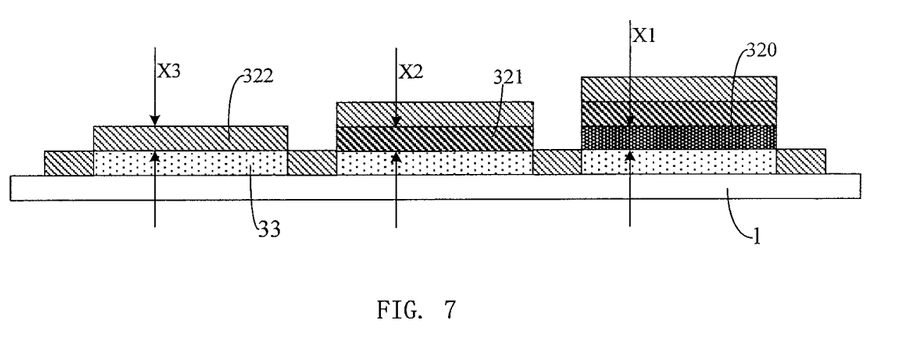

The step 05 is to form a third reflective electrode material film 322 with a third thickness X3 on the base substrate 1 formed with the second transparent conductive layers 33, as shown in FIG. 7.

Figure 8:
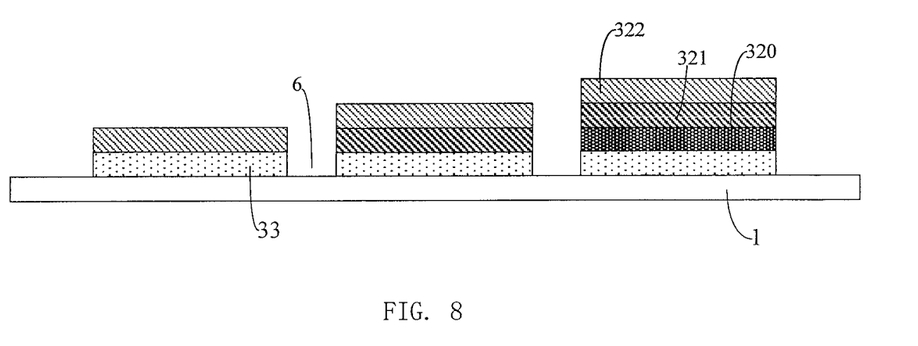

The step 06 is to remove the third reflective electrode material film 322 in the pixel definition layer formation region 6, as shown in FIG. 8.

After implementing the above steps 01-06, the thickness of the reflective electrode in the finally formed blue pixel is X1+X2+X3, the thickness of the reflective electrode in the green pixel is X2+X3, and the thickness of the reflective electrode in the red pixel is X3, thereby forming the reflective electrodes of different thicknesses.

Similarly, referring to FIG. 9 to FIG. 14, the forming the first transparent conductive layers specifically comprises the following steps 07 to 12.

Figure 9:
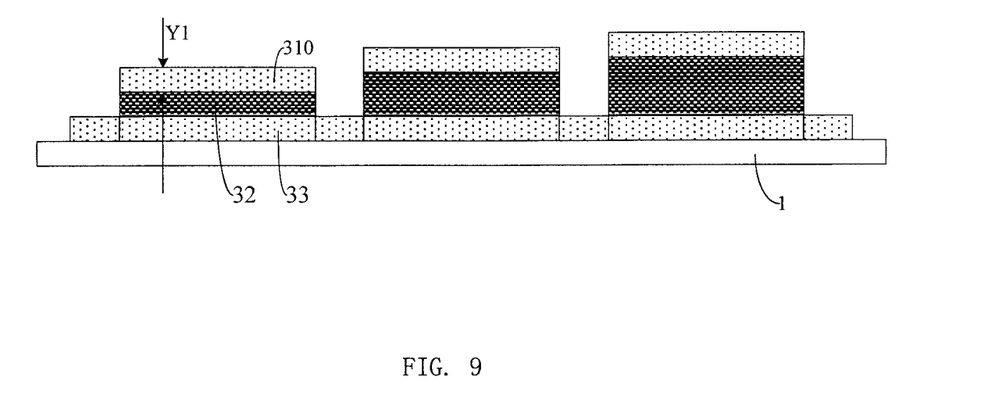
FIGS. 9-14 are respectively schematic views obtained after implementing steps of a method of manufacturing a display substrate according to an embodiment of the present disclosure, showing first transparent conductive layers of different thicknesses are respectively formed in pixels of different colors.

The step 07 is to form a first layer 310 of the first transparent conductive material films with a first thickness Y1 on the base substrate 1 formed with the second transparent conductive layers 33 and the reflective electrodes 32, as shown in FIG. 9.

Figure 10:
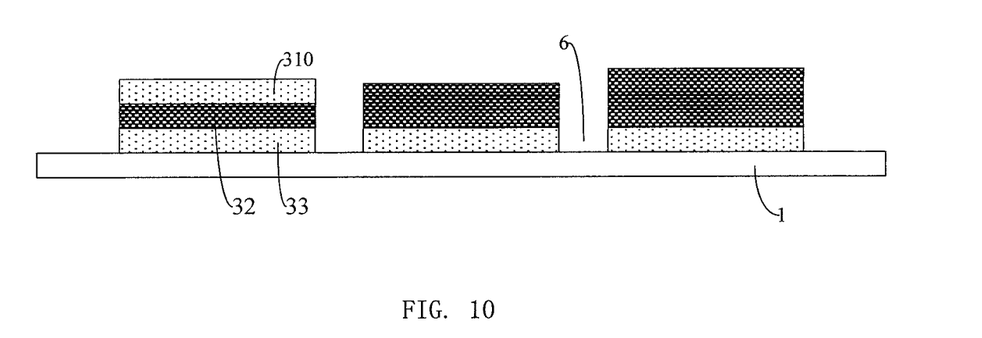

The step 08 is to remove the first layer 310 of the first transparent conductive material films in the blue pixel and the green pixel and the pixel definition layer formation region 6, as shown in FIG. 10.

Figure 11:
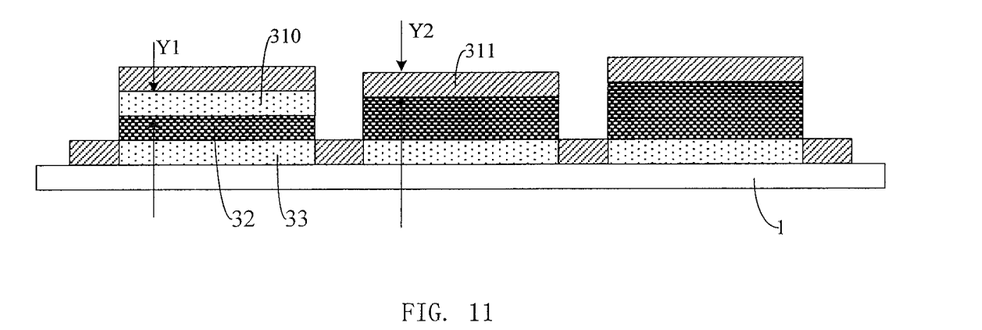

The step 09 is to form a second layer 311 of the first transparent conductive material films with a second thickness Y2 on the base substrate 1 formed with the second transparent conductive layers 33 and the reflective electrodes 32, as shown in FIG. 11.

Figure 12:
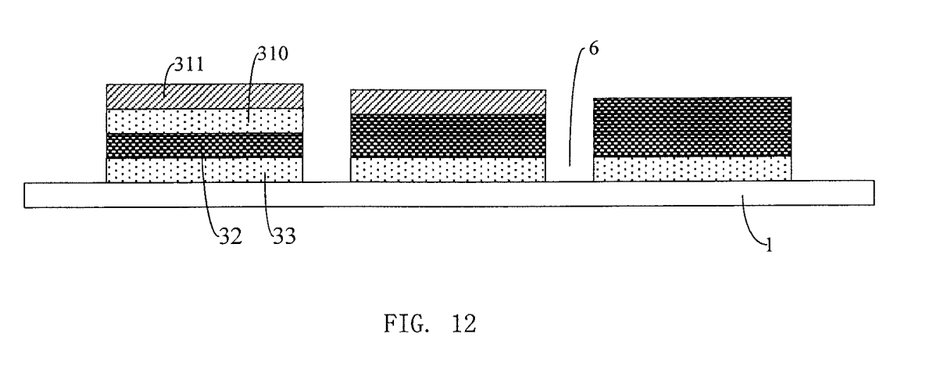

The step 10 is to remove the second layer 311 of the first transparent conductive material films in the blue pixel and the pixel definition layer formation region 6, as shown in FIG. 12.

Figure 13:
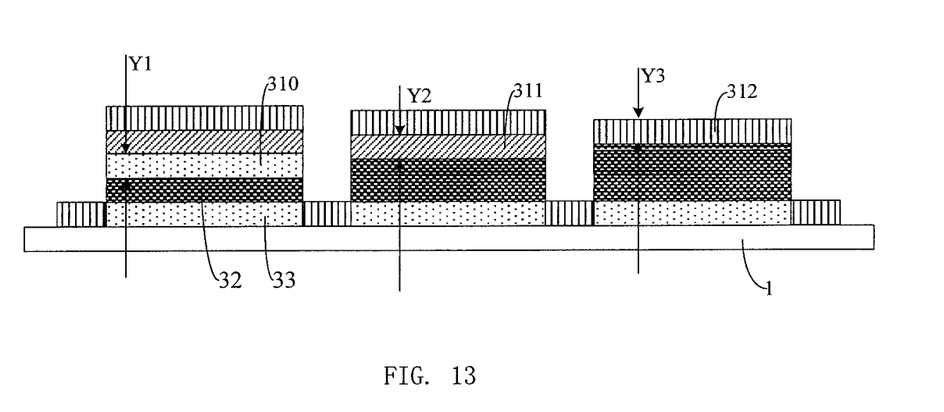

The step 11 is to form a third layer 312 of the first transparent conductive material films with a third thickness Y3 on the base substrate 1 formed with the second transparent conductive layers 33 and the reflective electrodes 32, as shown in FIG. 13.

Figure 14:
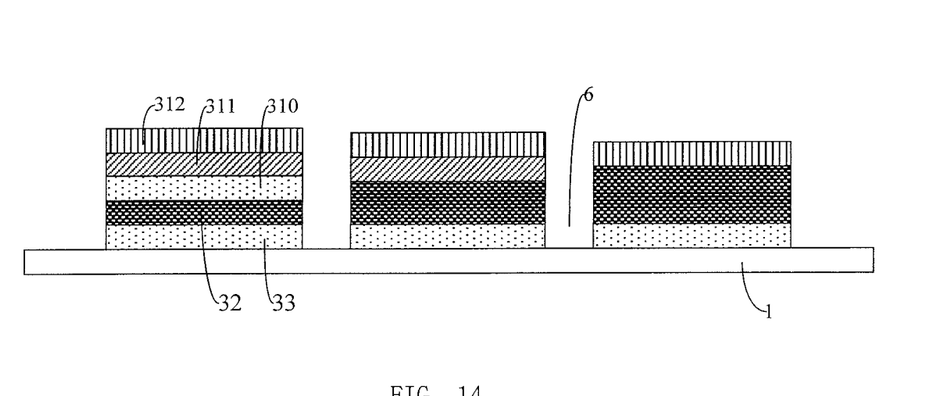

The step 12 is to remove the third layer 312 of the first transparent conductive material films in the pixel definition layer formation region 6, as shown in FIG. 14.

After implementing the above steps 07-12, the thickness of the first transparent conductive layer in the finally formed red pixel is Y1+Y2+Y3, the thickness of the first transparent conductive layer in the green pixel is Y2+Y3, and the thickness of the first transparent conductive layer in the blue pixel is Y3, thereby forming the first transparent conductive layers of different thicknesses.

In this embodiment, the second transparent conductive layers, the pixel definition layer, the light-emitting functional layers for different colors, and the second electrodes are respectively formed by conventional preparation processes, and the preparation processes are not described herein again.

According to another embodiment of the present disclosure, there is provided a display substrate. Different from the display substrate in the forgoing embodiments, in this embodiment, as shown in FIG. 15, the first electrode assembly 3 further comprises a second transparent conductive layer 33 on a side of the reflective electrode 32 close to the base substrate 1, thicknesses of the reflective electrodes 32 in the pixels of different colors are substantially the same, and thicknesses of the second transparent conductive layers 33 in the pixels of different colors are different from one another. That is, by setting the thicknesses of the second transparent conductive layers 33 in the pixels of different colors to be different, not only the optimal lengths of the micro-resonant cavities of the pixels of different colors in the display substrate are achieved, but also it is ensured that the surface of the pixel definition layer away from the base substrate is substantially flush with the surface of the light-emitting function layer away from the base substrate. As a result, not only the color purity and the luminous efficiency of the pixels of different colors in the display substrate are ensured, but also the poor lap joints of the second electrodes are eliminated.

In this embodiment, the pixels 10 on the base substrate include a red pixel, a green pixel, and a blue pixel, and the light-emitting function layers 4 in the pixels 10 respectively include a red light-emitting function layer 41, a green light-emitting function layer 42, and a blue light-emitting function layer 43. The thicknesses of the second transparent conductive layer 33 corresponding to the red light-emitting function layer 41, the green light-emitting function layer 42, and the blue light-emitting function layer 43 are sequentially increased. In this way, by adjusting thicknesses of the second transparent conductive layers 33 in the pixels of different colors, not only the optimal lengths of the micro-resonance cavities of the pixels of different colors are achieved, but also it is ensured that the surface of the pixel definition layer away from the base substrate is substantially flush with the surface of the light-emitting function layer away from the base substrate, thereby ensuring the color purity and luminous efficiency of the pixels of different colors on the display substrate are optimal, eliminating poor lap joints of the second electrodes 5, and thus ensuring the quality of the display substrate.

It should be noted that the thicknesses of the reflective electrodes 32 in the pixels of different colors may also be set to be different, and the thicknesses of the second transparent conductive layers 33 in the pixels of different colors may also be set to be different, as long as the optimal lengths of the micro-resonance cavities of the pixels of different colors are achieved and the surface 20 of the pixel definition layer 2 away from the base substrate 1 and the surface 40 of the light emitting function layer 4 away from the base substrate 1 are substantially flush, and details are not described herein.

Other structures of the display substrate in this embodiment are the same as those in the foregoing embodiments, and are not described herein again.

Based on the above structure of the display substrate in this embodiment, according to embodiments of the present disclosure, there is further provided a method of manufacturing a display substrate. Different from the method in the forgoing embodiments, in this embodiment, the forming the first electrode assemblies comprises: forming the second transparent conductive layers, the reflective electrodes and the first transparent conductive layers in that order. The forming the second transparent conductive layers comprises: forming a plurality of second transparent conductive material films in layers on the base substrate; and etching the second transparent conductive material films in the red pixel, the green pixel and the blue pixel, respectively, so that the numbers of layers of the second transparent conductive material films remained in the red pixel, the green pixel and the blue pixel are different.

In this embodiment, the forming the second transparent conductive layers specifically comprises the following steps 13 to 18.

The step 13 is to form a first layer of the second transparent conductive material films with a first thickness X1 on the base substrate.

The step 14 is to remove the first layer of the second transparent conductive material films in the red pixel and the green pixel and the pixel definition layer formation region.

The step 15 is to form a second layer of the second transparent conductive material films with a second thickness X2 on the base substrate.

The step 16 is to remove the second layer of the second transparent conductive material films in the red pixel and the pixel definition layer formation region.

The step 17 is to form a third layer of the second transparent conductive material films with a third thickness X3 on the base substrate.

The step 18 is to remove the third layer of the second transparent conductive material films in the pixel definition layer formation region.

After implementing the above steps 13-18, the thickness of the second transparent conductive layer in the finally formed blue pixel is X1+X2+X3, the thickness of the second transparent conductive layer in the green pixel is X2+X3, and the thickness of the second transparent conductive layer in the red pixel is X3, thereby forming the second transparent conductive layers of different thicknesses.

In this embodiment, the reflective electrodes, the pixel definition layer, the light-emitting functional layers for different colors, and the second electrodes are respectively formed by conventional preparation processes, and the preparation processes are not described herein again.

Other steps of the method in this embodiment are the same or similar to those of the method in the forgoing embodiments, and are not described herein again.

With the display substrate according to the abovementioned embodiments, by setting different distances between the reflective surfaces of the first electrode assemblies in the pixels of different colors and the base substrate, respectively, the distances between the surface of the pixel definition layer away from the base substrate and the surfaces of the light-emitting function layers away from the base substrate are reduced to be less than or equal to a preset threshold. Compared with the conventional display substrate, the distances are significantly reduced, and the optimal lengths of the micro-resonant cavities of the pixels of different colors in the display substrate are achieved. As a result, it is ensured that the lap surface of the second electrodes 5 tends to be gentle while ensuring the color purity and the luminous efficiency of the pixels of different colors, thereby reducing or eliminating the poor lap joints of the second electrodes 5.

According to still another embodiment of the present disclosure, there is provided a display panel comprising the display substrate according to any of the abovementioned embodiments.

By using the display substrate according to any of the abovementioned embodiments, the color purity and luminous efficiency of the display panel can be ensured, and the quality of the display panel can be improved.

The display panel according to the embodiments of the present disclosure may be any product or component having a display function, such as an OLED panel, an OLED TV, a display, a mobile phone, a navigator, or the like, or a semi-finished product of the abovementioned product or component having the display function.

It is to be understood that the above embodiments are merely exemplary embodiments employed to explain the principles of the present disclosure, but the present disclosure is not limited thereto. Various changes and modifications can be made by those skilled in the art without departing from the spirit and scope of the present disclosure, and such changes and modifications also fall within the scope of the present disclosure.

What is claimed is:

1. A display substrate, comprising:
a base substrate,
a plurality of pixels on the base substrate; and
a pixel definition layer on the base substrate, the pixel definition layer defining the pixels and separating the pixels from one another;
wherein, each of the pixels comprises: a first electrode assembly, a light-emitting function layer and a second electrode arranged sequentially in a direction away from the base substrate, and the second electrodes of the pixels form a common electrode layer extending over the pixel definition layer;
wherein, in each of the pixels, a distance between a surface of the pixel definition layer away from the base substrate and a surface of the light-emitting function layer away from the base substrate in the direction away from the base substrate is less than or equal to a preset threshold that is in a range of about 0 Å to about 300 Å;
wherein, distances between the reflective surfaces of the first electrode assemblies in the pixels of different colors and the base substrate are different, and distances between the surfaces of the light-emitting function layers away from the base substrate in the pixels of different colors and the base substrate are substantially the same,
wherein the first electrode assembly comprises reflective electrodes, and the reflective electrodes in the pixels of different colors have different thicknesses.

2. The display substrate of claim 1, wherein
the first electrode assemblies have light reflective property, and the second electrodes have light transflective property; and
the first electrode assembly in each of the pixels has a thickness configured such that a micro resonance cavity of the pixel in question has a length corresponding to a color of the each of the pixels, the length of the micro resonance cavity being a distance between a reflective surface of the first electrode assembly and a light exit surface of the second electrode in the each of the pixels.

3. The display substrate of claim 1, wherein the surface of the pixel definition layer away from the base substrate and the surface of the light-emitting function layer away from the base substrate are substantially aligned with each other.

4. The display substrate of claim 1, wherein the light-emitting function layers in the pixels have a substantially same thickness.

5. The display substrate of claim 4, wherein the light-emitting function layer comprises a hole transport sub-layer, a hole injection sub-layer, a light emitting sub-layer, an electron injection sub-layer, and an electron transport sub-layer.

6. The display substrate of claim 2, wherein the first electrode assembly further comprises a first transparent conductive layer, wherein the reflective electrode and the first transparent conductive layer arranged sequentially in the direction away from the base substrate, and the reflective surface of the first electrode assembly is a surface of the reflective electrode close to the first transparent conductive layer.

7. The display substrate of claim 6, wherein the pixels comprises a red pixel, a green pixel and a blue pixel, and thicknesses of the first transparent conductive layers in the red pixel, the green pixel and the blue pixel are different from one another.

8. The display substrate of claim 7, wherein the first electrode assembly in each of the pixels further comprises a second transparent conductive layer on a side of the reflective electrode close to the base substrate, thicknesses of the reflective electrodes in the red pixel, the green pixel and the blue pixel are different from one another, and thicknesses of the second transparent conductive layers in the red pixel, the green pixel and the blue pixel are substantially the same.

9. The display substrate of claim 7, wherein the first electrode assembly in each of the pixels further comprises a second transparent conductive layer on a side of the reflective electrode close to the base substrate, thicknesses of the reflective electrodes in the red pixel, the green pixel and the blue pixel are substantially the same, and thicknesses of the second transparent conductive layers in the red pixel, the green pixel and the blue pixel are different from one another.

10. The display substrate of claim 7, wherein the light-emitting function layers in the red pixel, the green pixel and the blue pixel are a red light-emitting function layer, a green light-emitting function layer and a blue light-emitting function layer, respectively, and thicknesses of the first transparent conductive layers in the red pixel, the green pixel and the blue pixel are decreased in that order.

11. The display substrate of claim 8, wherein the light-emitting function layers in the red pixel, the green pixel and the blue pixel are a red light-emitting function layer, a green light-emitting function layer and a blue light-emitting function layer, respectively, and thicknesses of the reflective electrodes in the red pixel, the green pixel and the blue pixel are increased in that order.

12. The display substrate of claim 9, wherein the light-emitting function layers in the red pixel, the green pixel and the blue pixel are a red light-emitting function layer, a green light-emitting function layer and a blue light-emitting function layer, respectively, and thicknesses of the second transparent conductive layers in the red pixel, the green pixel and the blue pixel are increased in that order.

13. A display panel comprising a display substrate wherein the display substrate comprises:
  a base substrate,
  a plurality of pixels on the base substrate; and
  a pixel definition layer on the base substrate, the pixel definition layer defining the pixels and separating the pixels from one another;
  wherein, each of the pixels comprises: a first electrode assembly, a light-emitting function layer and a second electrode arranged sequentially in a direction away from the base substrate, and the second electrodes of the pixels form a common electrode layer extending over the pixel definition layer;
  wherein, in each of the pixels, a distance between a surface of the pixel definition layer away from the base substrate and a surface of the light-emitting function layer away from the base substrate in the direction away from the base substrate is less than or equal to a preset threshold that is in a range of about 0 Å to about 300 Å;
  wherein, distances between the reflective surfaces of the first electrode assemblies in the pixels of different colors and the base substrate are different, and distances between the surfaces of the light-emitting function layers away from the base substrate in the pixels of different colors and the base substrate are substantially the same.

* * * * *